United States Patent [19]
Takagi

[11] Patent Number: 5,636,234
[45] Date of Patent: Jun. 3, 1997

[54] SEMICONDUCTOR LASER DEVICE INCLUDING HEAT SINK WITH PN JUNCTION

[75] Inventor: Kazuhisa Takagi, Hyogo, Japan

[73] Assignee: Mitsubishi Denki Kabushiki Kaisha, Tokyo, Japan

[21] Appl. No.: 491,068

[22] Filed: Jun. 16, 1995

[30] Foreign Application Priority Data

Mar. 23, 1995 [JP] Japan ................................ 7-064603

[51] Int. Cl.[6] ................................................. H01S 3/19
[52] U.S. Cl. ........................ 372/43; 372/36; 372/50; 257/96; 257/707
[58] Field of Search ........................ 372/36, 50, 43; 257/707, 96

[56] References Cited

U.S. PATENT DOCUMENTS

| | | | |
|---|---|---|---|
| 4,092,614 | 5/1978 | Sakuma et al. | 372/50 |
| 4,106,043 | 8/1978 | Culshaw | 257/106 |
| 4,627,062 | 12/1986 | Bender | 372/36 |
| 5,212,706 | 5/1993 | Jain | 372/50 |

FOREIGN PATENT DOCUMENTS

| | | | |
|---|---|---|---|
| 60-103687 | 6/1985 | Japan | 372/43 |
| 2-251190 | 10/1990 | Japan | 372/36 |
| 2-278783 | 11/1990 | Japan | 372/36 |
| 5-102602 | 4/1993 | Japan | 372/43 |
| 2131607 | 6/1984 | United Kingdom . | |
| 2178595 | 2/1987 | United Kingdom . | |
| 2197126 | 5/1988 | United Kingdom . | |

Primary Examiner—Rodney B. Bovernick
Assistant Examiner—Yisun Song
Attorney, Agent, or Firm—Leydig, Voit & Mayer

[57] ABSTRACT

A semiconductor laser device includes a semiconductor laser chip containing a diode having a polarity; a heat sink on which the semiconductor laser chip is mounted at an interface of the semiconductor laser chip and the heat sink, the heat sink including a pn junction generally parallel to the interface; and a block on which the heat sink is mounted, wherein the diode of the semiconductor laser chip and the pn junction are electrically connected in parallel and in opposite polarity so that the pn junction of the heat sink functions as a reverse current blocking diode for the semiconductor laser chip.

5 Claims, 8 Drawing Sheets

5,636,234

SEMICONDUCTOR LASER DEVICE INCLUDING HEAT SINK WITH PN JUNCTION

FIELD OF THE INVENTION

The present invention relates to a semiconductor laser device producing relatively high power light to use in measuring a distance, for optical communication, and for other applications. In particular, the present invention relates to a semiconductor laser device mounted on a heat sink that includes a pn junction.

BACKGROUND OF THE INVENTION

FIG. 12 is a perspective view of a semiconductor laser device including a semiconductor laser chip 1 that is disposed on an electrically insulating heat sink 2, such as SiC, which, in turn, is mounted on a block 3 of a good thermal conductor, such as silver or a copper/tungsten alloy. An electrode 4' extends from the interface of the semiconductor laser chip 1 and the heat sink 2 and is electrically connected to the block 3 by a wire 5. A surface electrode 4 on the opposite surface of the semiconductor laser chip 1 from the heat sink 2 is connected by a wire 6 to one terminal 7 of a power supply (not shown). The block 3 is electrically connected to the other terminal of the power supply.

FIG. 13 is a schematic diagram of a conventional semiconductor laser device circuit including a laser diode LD, such as the semiconductor laser device shown in FIG. 12, and a driver V. The driver V produces a large current pulse that is supplied to the semiconductor laser LD. The circuit of FIG. 13 includes a reverse current blocking diode D connected in parallel to and in the same polarity as the power supply. The reverse current blocking diode D and driver V are connected through a parasitic inductance L to the laser diode LD. The parasitic inductance L is an inherent feature of the circuit and is not an added inductance. When the driver V produces a forward-going pulse for the laser diode LD, the parasitic inductance L may cause a counter electromotive force (emf) to be produced with a magnitude v=−L*dI/dt where L is the inductance of the parasitic inductance and dI/dt is the rate of change of the current through the circuit with time. The reverse polarity counter emf produces a current that is blocked by the reverse current blocking diode D, thereby protecting the driver V. However, if the magnitude of the counter emf exceeds the maximum reverse bias voltage that the laser diode LD can withstand, then a large reverse current flows in the laser diode LD. This large reverse current can damage and even destroy the laser diode LD.

SUMMARY OF THE INVENTION

The present invention is intended to solve the problem of damage to a laser diode caused by a counter emf and thereby provide a highly reliable semiconductor laser device.

A semiconductor laser device according to the invention comprises a semiconductor laser chip including a diode having a polarity; a heat sink on which the semiconductor laser chip is mounted at an interface of the semiconductor laser chip and the heat sink, the heat sink including a pn junction generally parallel to the interface; and a block on which the heat sink is mounted, wherein the diode of the semiconductor laser chip and the pn junction of the heat sink are electrically connected in parallel and in opposite polarity so that the pn junction of the heat sink functions as a reverse current blocking diode for the semiconductor laser chip.

The heat sink may include a plurality of heat sink elements laminated to each other with each element including a pn junction. Alternatively, the heat sink may include a plurality of layers forming multiple pn junctions and including tunnel diodes between adjacent pairs of the pn junctions to provide easy current flow in a forward direction of the heat sink. To avoid thermal stresses, the semiconductor laser chip and the heat sink may be made of the same material. In fact, a second semiconductor laser chip may be used as the heat sink.

A semiconductor laser device according to the invention includes a semiconductor substrate; a plurality of layers forming a pn junction and disposed on the semiconductor substrate; a contact layer disposed on the layers forming the pn junction; a semiconductor laser including a plurality of semiconductor layers disposed on the contact layer; and electrodes respectively disposed on the contact layer, the semiconductor laser, and the semiconductor substrate, wherein the semiconductor laser and the pn junction are electrically connected in parallel and in opposite polarity to each other so that the pn junction functions as a reverse current blocking diode for the semiconductor laser.

BRIEF DESCRIPTION OF THE DRAWINGS

In all figures, like elements are shown with the same reference numbers.

DETAILED DESCRIPTION OF PREFERRED EMBODIMENTS

First Embodiment

Figure 1:
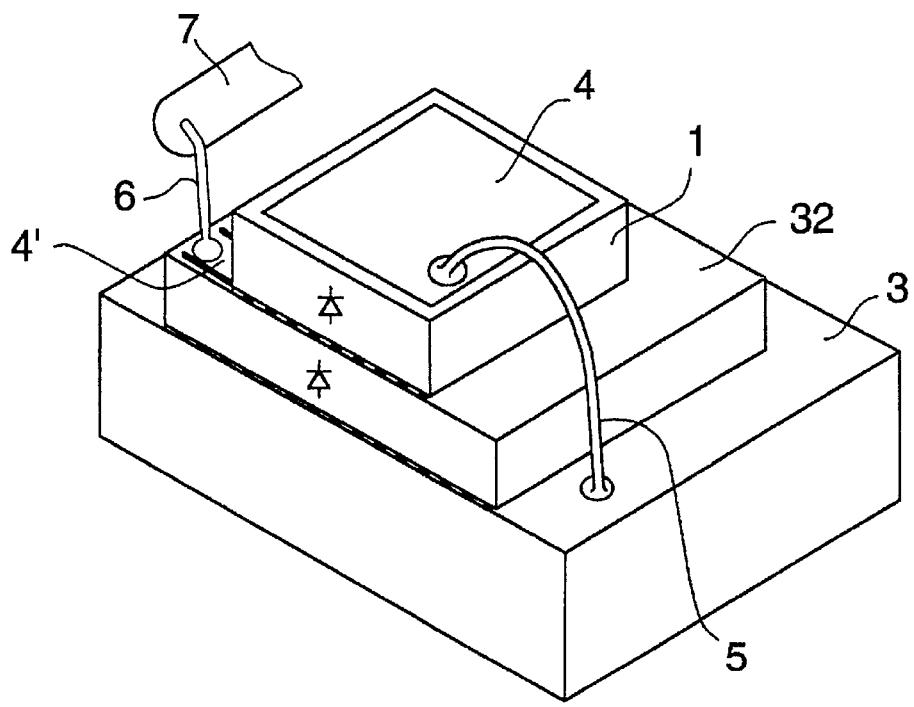
FIG. 1 is a perspective view of a semiconductor laser device according to an embodiment of the present invention.

FIG. 1 is a perspective view of a semiconductor laser device according to a first embodiment of the present invention. In this and other embodiments, the semiconductor laser device is generally operated by applying to it a short pulse having a peak current in the forward direction of the semiconductor laser diode within the semiconductor laser chip 1 of $I_{f_p}$. $I_{f_p}$ is at least 10 amperes and is driven by a forward direction peak voltage $V_{f_p}$ of at least 10 volts. The pulse width is no more than 500 nanoseconds (ns). The light output in response to that pulse has a peak power of at least 10 watts.

The semiconductor laser device of FIG. 1 includes a semiconductor laser chip 1 mounted on a heat sink 32. The heat sink 32 includes a pn junction transverse to the thickness of the heat sink and of the semiconductor laser chip 1. In other words, the pn junction within the heat sink 32 is generally parallel to the interface between the heat sink 32 and the semiconductor laser chip 1. The heat sink 32 is preferably silicon and is mounted on a block 3 of silver or a copper/tungsten alloy. The semiconductor laser chip preferably includes a GaAs substrate if the wavelength of light produced by the chip is approximately 850 nanometers (nm). If the radiated light has a wavelength of about 1550 nm, then the semiconductor laser chip 1 includes an InP substrate.

Figure 2:
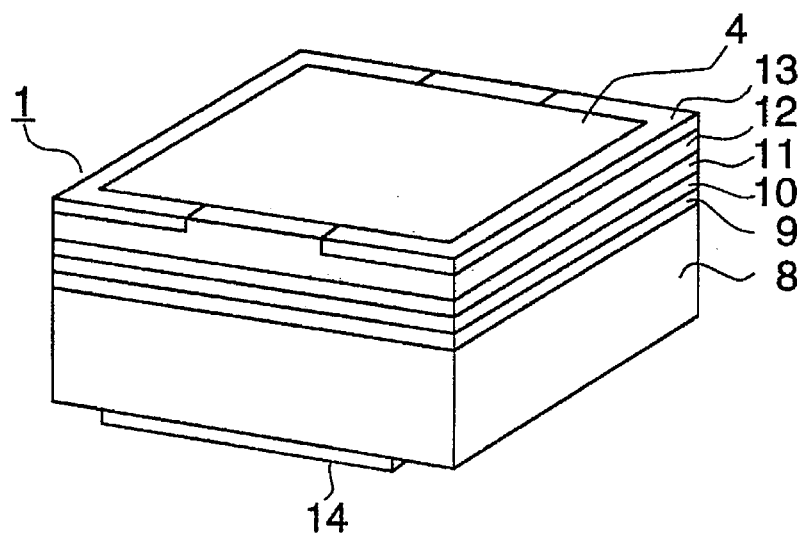
FIG. 2 is a perspective view of a semiconductor laser chip that may be used in embodiments of the present invention.

FIG. 2 is a perspective view of a semiconductor laser chip, such as the chip 1 illustrated in FIG. 1. The semiconductor laser chip has an insulating film stripe structure to withstand a large current pulse. The semiconductor laser chip of FIG. 2 includes an n-type InP substrate 8 on which are successively disposed an n-type InP cladding layer 9, an active layer 10, a p-type InP cladding layer 11, a p-type InGaAs contact layer 12, and an insulating $SiO_2$ film 13. A rear electrode 14 is disposed on the substrate 8 opposite the layer 9 and on the opposite side of the semiconductor laser chip from a surface electrode 4. The layers of the semiconductor laser chip of FIG. 2 are grown by a suitable method, such as liquid phase epitaxy (LPE) or metal organic chemical vapor deposition (MOCVD). The semiconductor laser chip of FIG. 2 is mounted on a heat sink at the rear electrode 14.

Figure 3:
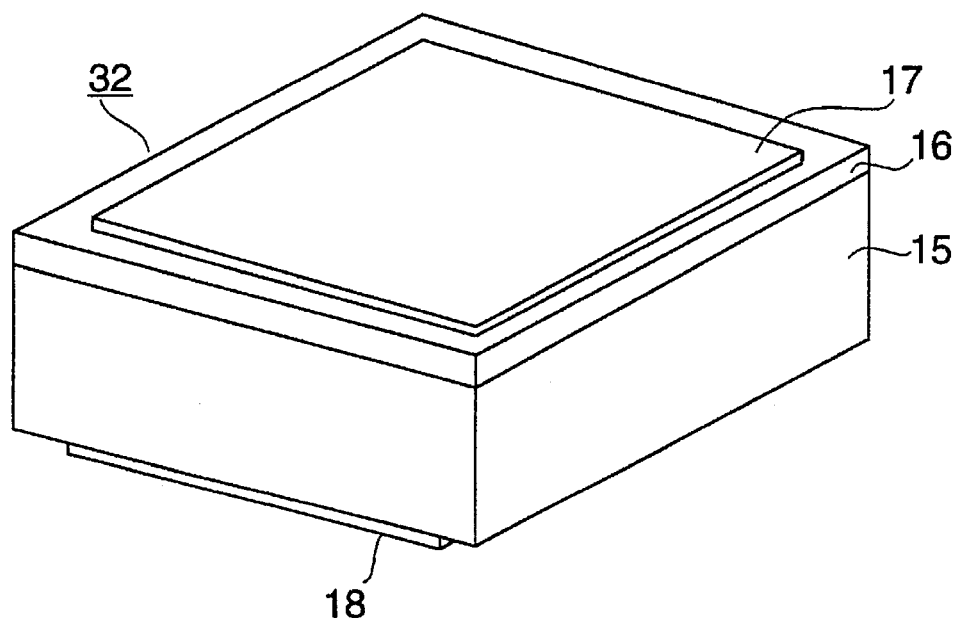
FIG. 3 is a perspective view of a heat sink that may be used in embodiments of the present invention.

FIG. 3 is a perspective view of the heat sink 32 of the semiconductor laser device of FIG. 1. The heat sink 32 includes an n-type substrate 15, a p-type layer 16, a front surface AuSn solder layer 17, and a rear surface AuSn solder layer 18. The pn junction within the heat sink 32 between and generally parallel to the solder layers 17 and 18 is formed by any suitable method, such as growing the p-type layer 16 by MOCVD or LPE or by diffusing a dopant impurity producing the p-type layer 16 into the n-type silicon substrate 15. The semiconductor laser chip 1 is mounted on the heat sink 32 by die bonding, i.e., with sufficient heat to melt the AuSn solder so that a suitable mechanical and electrical bond between the chip 1 and the heat sink 32 is formed.

Figure 4:
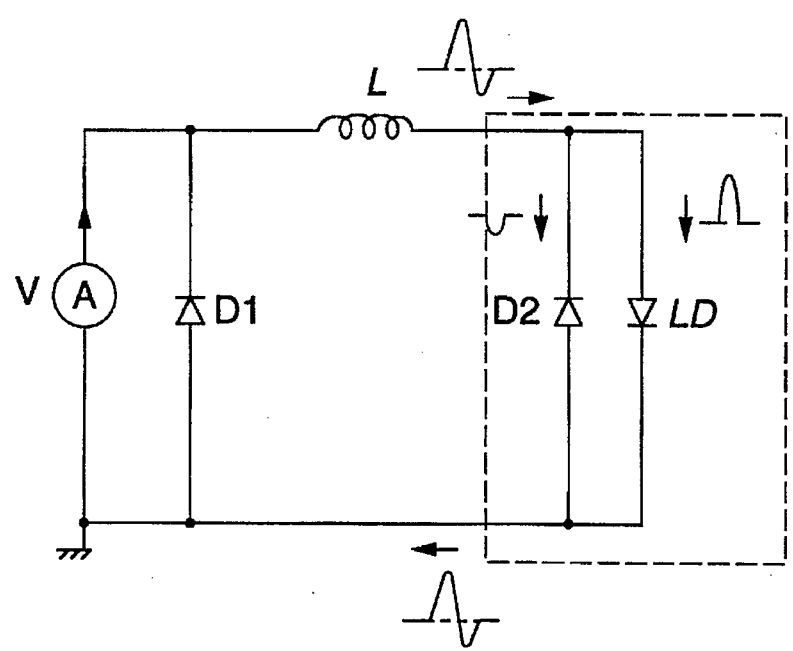
FIG. 4 is a circuit diagram illustrating the operation of an embodiment of the present invention.
Figure 13:
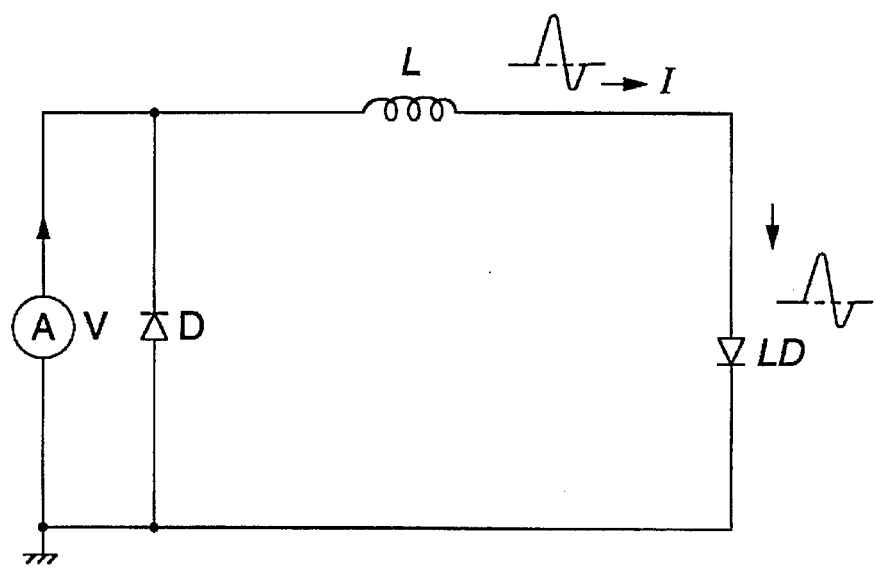
FIG. 13 is a circuit diagram including the conventional semiconductor laser device of FIG. 12.

FIG. 4 is a circuit diagram showing the semiconductor laser device of FIG. 1 connected to a drive circuit of the type illustrated in FIG. 13. In addition to the elements of FIG. 13, a diode D2 is present in FIG. 4. That diode is present within the heat sink 32. The semiconductor laser device including the heat sink 32 and the semiconductor laser chip 1 are indicated within the dotted line in FIG. 4. The diode D2 is electrically connected in parallel and in reverse polarity to the laser diode LD of the semiconductor laser device.

In the invention, in addition to the protection provided to the driver V by the diode D1, the reverse current blocking diode D2 of the heat sink protects the laser diode LD from excessive reverse current voltages and current flows. The diode D2 provides a bypass, i.e., a current path, through which a current produced by the counter emf generated by the parasitic inductance L easily flows. As a result of that current flow, no large reverse current flows through the semiconductor laser diode LD because the diode D2 essentially short-circuits that counter emf. The pn junction D2 of the heat sink is sometimes referred to as a reverse current blocking diode because it blocks the reverse current from passing through the diode LD. That blocking is achieved by providing the bypass path. The bypass path short-circuit also prevents any significant reverse bias voltage from being applied to the laser diode LD.

The reverse polarity connection of the diode D2 of the heat sink 32 and the diode LD of the semiconductor laser chip is produced by the wiring interconnection illustrated in FIG. 1. There, the front surface electrode 4 of the semiconductor laser chip 1 is electrically connected to the block 3 by the wire 5. A wire 6 connects an electrode 4' extending from the interface of the heat sink 32 and the semiconductor laser chip 1 to a terminal 7 of a power supply. The other terminal of the power supply is electrically connected to the block 3. As illustrated in FIG. 1, the laser diode and the diode of the heat sink 32 are mechanically arranged in series. However, the electrical connections made with the wires 5 and 6 provide the reverse polarity and parallel electrical connection illustrated in FIG. 4.

The diode D2 within the heat sink 32 is subjected to the voltage of the forward current pulse applied to the semiconductor laser chip, i.e., the diode LD, to produce light, as a reverse bias voltage. Therefore, that pn junction D2 within the heat sink 32 must be able to withstand, without breakdown, as a reverse voltage, the maximum forward voltage applied to the semiconductor laser chip 1. Therefore, the maximum reverse bias voltage, $V_{RS}$, that the pn junction of the heat sink 32 can withstand must satisfy $$V_{RS} > R_d \times I_{f_p}$$

where $R_d$ is the differential resistance of the pn junction of the heat sink 32. For example, when $I_{f_p}$ equals 60 amperes and $R_d$ equals 1 ohm, the pn junction of the heat sink 32 must be able to withstand a reverse bias voltage $V_{RS}$ of at least 60 volts.

Second Embodiment

In the first embodiment, the anode of the semiconductor laser chip 1 and the cathode of the pn junction of the heat sink 32 are electrically connected to each other by the bonding of the semiconductor laser chip to the heat sink. The other terminals of those two diodes are electrically connected by the wire 5. However, the connections may be reversed so that the cathode of the diode of the semiconductor laser chip 1 and the anode of the pn junction in the heat sink 32 are bonded together and thereby electrically connected, with the other terminals of the diodes electrically connected by the wire 5.

Third Embodiment

The heat sink 32 according to the first embodiment includes a single pn junction. When the heat sink is made of silicon, the pn junction can generally withstand a reverse bias voltage of several tens of volts. If the semiconductor laser chip 1 is driven by a large pulse, the maximum reverse bias voltage that the pn junction of the heat sink 32 can withstand may be exceeded, resulting in breakdown and potential damage of that pn junction.

Figure 5:
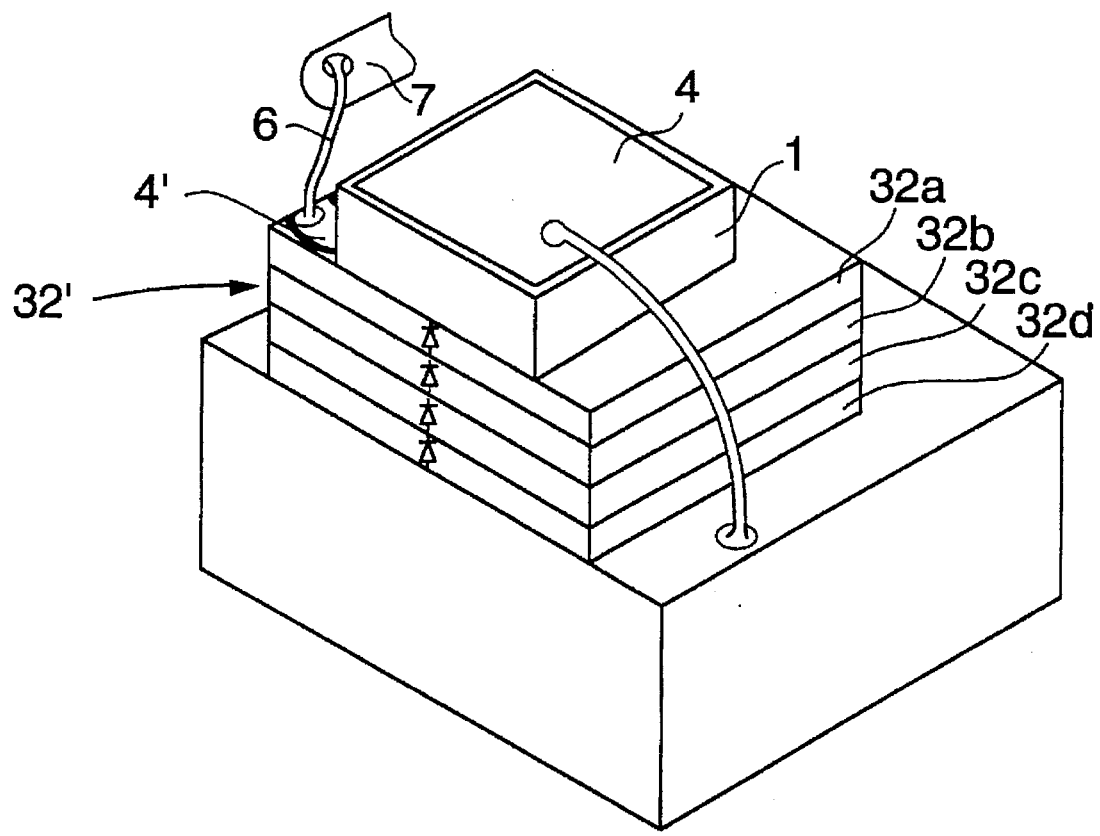
FIG. 5 is a perspective view of a semiconductor laser device according to an embodiment of the present invention.

In the third embodiment, as shown in FIG. 5, the heat sink 32' comprises heat sink elements 32a, 32b, 32c, and 32d that are laminated to each other in a stack with AuSn solder. Each of the heat sink elements is essentially identical to the heat sink 32 according to the first embodiment and includes a pn junction generally parallel to the interface of the heat sink and the semiconductor laser chip 1. Since those pn junctions are connected in series in the heat sink 32', the maximum reverse bias voltage that the heat sink 32' can withstand is significantly increased, i.e., is the sum of maximum reverse bias voltages of the individual pn junctions.

Figure 6:
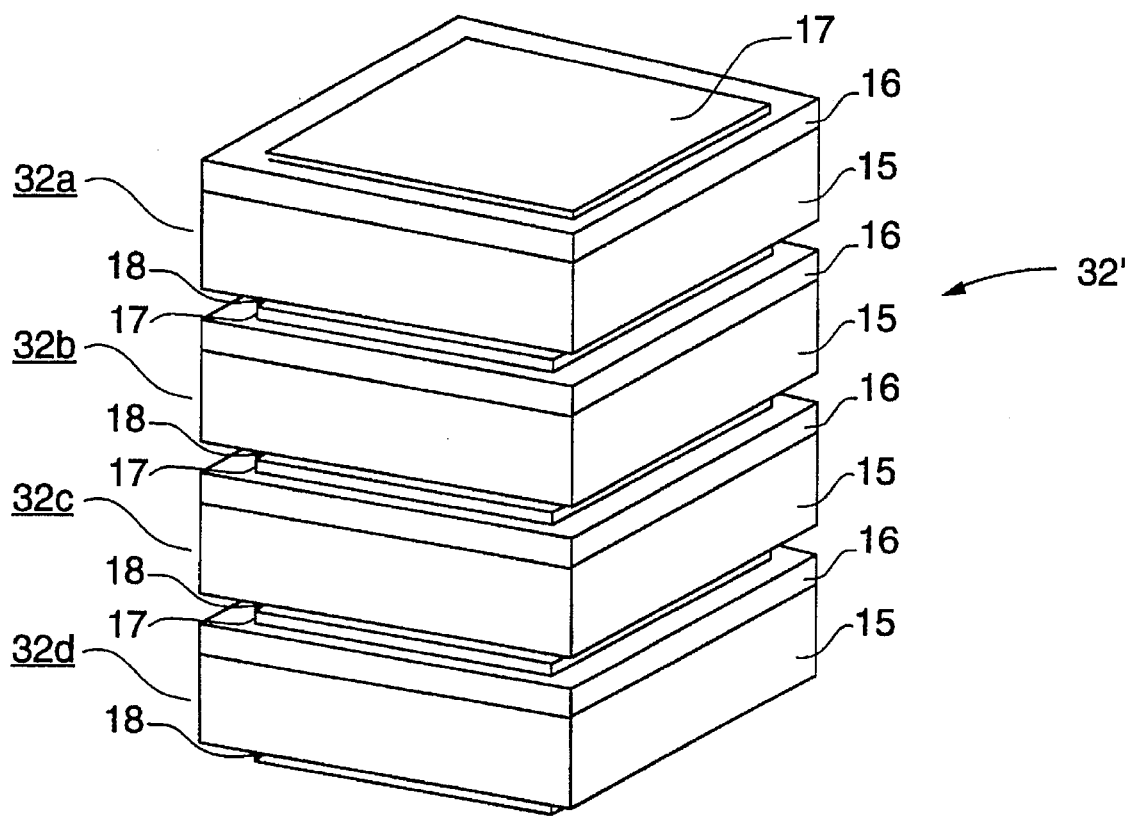
FIG. 6 is a perspective view of a heat sink that may be used in embodiments of the present invention.

FIG. 6 illustrates in greater detail the heat sink 32' and the respective heat sink elements 32a, 32b, 32c, and 32d. Each of the heat sink elements is separately manufactured using the processes previously described. Assuming the heat sink elements are all identical, the maximum reverse bias $V_{RS}$ that the laminated heat sink can withstand is $n \times v_{RS}$ where $v_{RS}$ is the maximum reverse bias voltage that a single pn junction of the heat sink element can withstand and n is the number of such heat sink elements. Therefore, the number of heat sink elements needed to withstand a voltage $V_{RS}$ is $n > (R_d \times I_p)/v_{RS}$.

Figure 7:
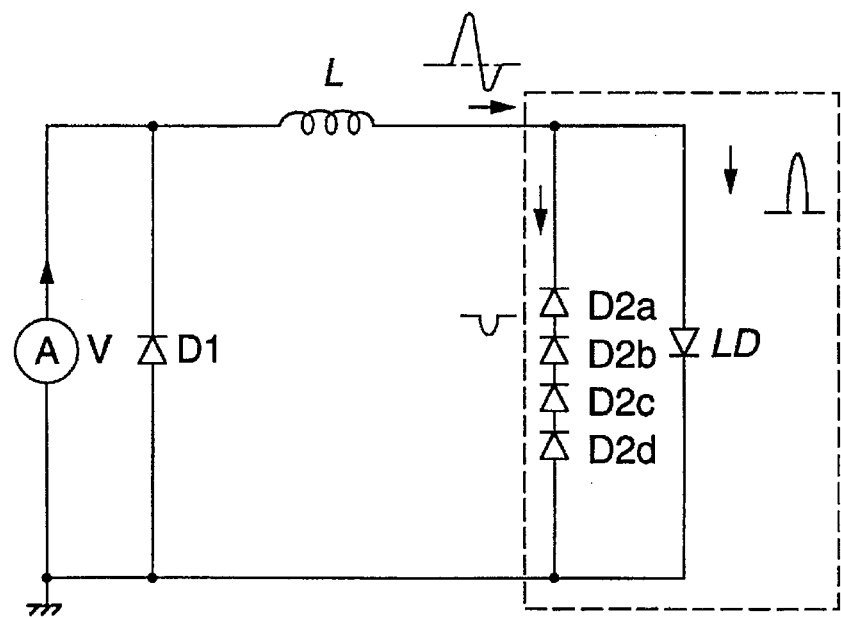
FIG. 7 is a circuit diagram illustrating the operation of an embodiment of the present invention.

FIG. 7 is an equivalent circuit diagram illustrating the semiconductor laser device according to the third embodiment and connected to a driving circuit. The heat sink 32' and the semiconductor laser chip 1 are indicated in FIG. 7 within the dotted line. Instead of the single diode D2, as in FIG. 4, the heat sink is represented by four series-connected diodes D32a, D32b, D32c, and D32d. Of course, the number of heat sink elements and pn junctions is not limited to four but may be freely increased or decreased so long as the total maximum reverse bias voltage that the heat sink 32' can withstand exceeds the maximum forward voltage that is applied to the semiconductor laser chip 1 by a forward direction pulse.

Fourth Embodiment

In the third embodiment, the heat sink 32' includes a plurality of heat sink elements that are bonded together with each heat sink element including a respective pn junction. The plurality of pn junctions connected in series increases the reverse bias voltage that the heat sink can withstand without breakdown. In the fourth embodiment, a plurality of pn junctions are formed within a heat sink having a single, unitary body rather than in a plurality of heat sink elements laminated together. The semiconductor body including the multiple pn junctions is prepared by a crystalline growth method, such as LPE, MOCVD, or molecular beam epitaxy (MBE). A tunnel diode layer including heavily doped p-type and n-type layers is disposed between each adjacent pair of pn junctions within the unitary heat sink body.

Figure 8:
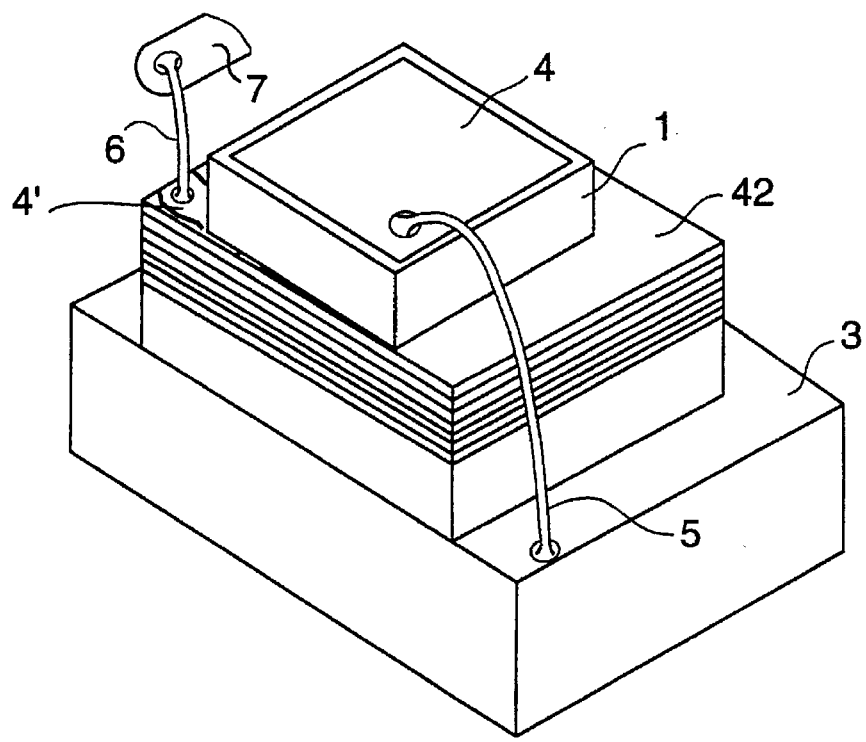
FIG. 8 is a perspective view of a semiconductor laser device according to an embodiment of the present invention.
Figure 9A:
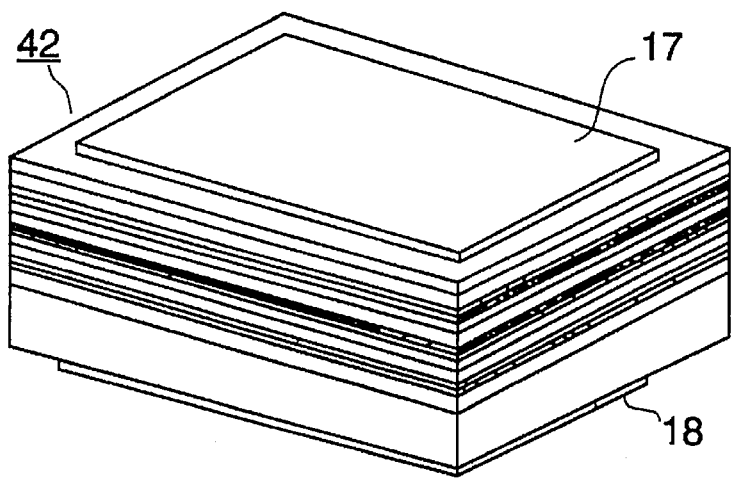
FIG. 9A is a perspective view of a heat sink that may be used in embodiments of the present invention and FIG. 9B is a fragmentary cross-sectional view of the heat sink of FIG. 9A.
Figure 9B:
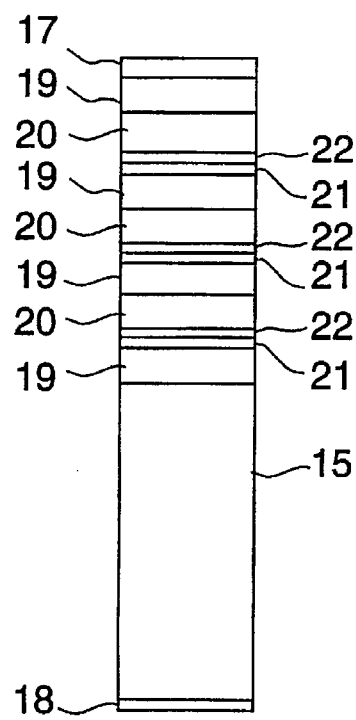

FIG. 8 is a perspective view of a semiconductor laser device according to the fourth embodiment and including a heat sink 42. FIG. 9A is a perspective view of the heat sink 42 and FIG. 9B is a fragmentary cross-sectional view illustrating the layers within the heat sink 42. In FIG. 9B, each pn junction includes a p-type layer 19 and an n-type layer 20. Disposed between each pair of adjacent pn junctions are a p⁺-type layer 21 and an n⁺-type layer 22 forming a tunnel diode. If the tunnel diodes are not included, then the pn junctions form a p-n-p-n ... structure with the result that current does not flow easily in the structure in either direction transverse to those layers. However, by including the tunnel diodes, producing a p-n-n⁺-p⁺-p-n ... structure, current flows between adjacent pn junctions by tunneling through the intervening tunnel diode. Thus, a current can easily flow in a forward direction through the heat sink 42.

In this fourth embodiment, the maximum reverse bias voltage that the heat sink 42 can withstand is increased as in the third embodiment but the necessity of bonding together a plurality of heat sink elements is avoided, simplifying production, reducing cost, and improving reliability.

Fifth Embodiment

In the heat sinks employed in the previously described embodiments, the heat sink body is preferably silicon. The heat sink body may be any semiconductor material, such as InP, GaAs, and InGaAs, with similar advantages. It is essential only that the pn junction or junctions be present in the semiconductor material used as the heat sink body. If the semiconductor laser chip and the heat sink are made of the same material, then the thermal expansion coefficients of the heat sink and the semiconductor laser chip are identical and no thermally induced stress occurs between the semiconductor laser chip and the heat sink when the temperature changes. The matching of thermal expansion coefficients improves the reliability of the semiconductor laser device.

Sixth Embodiment

In the sixth embodiment, a semiconductor laser chip is used as a heat sink. In this embodiment, two semiconductor laser chips are taken from the same wafer on which many semiconductor laser chips are prepared. One of those semiconductor laser chips is used as the heat sink and the other is used as the light-producing semiconductor laser chip. This result can be achieved because the semiconductor laser chip, as discussed above, includes a structure that functions as a diode. When the heat sink is a semiconductor laser chip, measures are taken to ensure that any light generated in the heat sink does not interfere with the light produced by the semiconductor laser chip. In this embodiment, the manufacturing process can be simplified because the heat sink is prepared at the same time and using the same processing steps as are used to produce the semiconductor laser chip.

Seventh Embodiment

Figure 10:
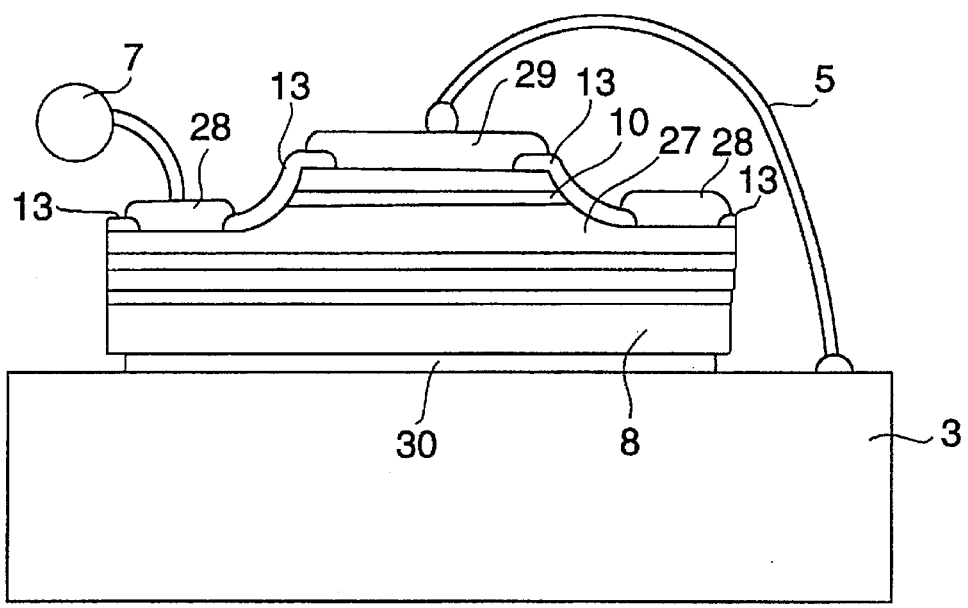
FIG. 10 is a cross-sectional view of a semiconductor laser device according to an embodiment of the present invention.
Figure 11:
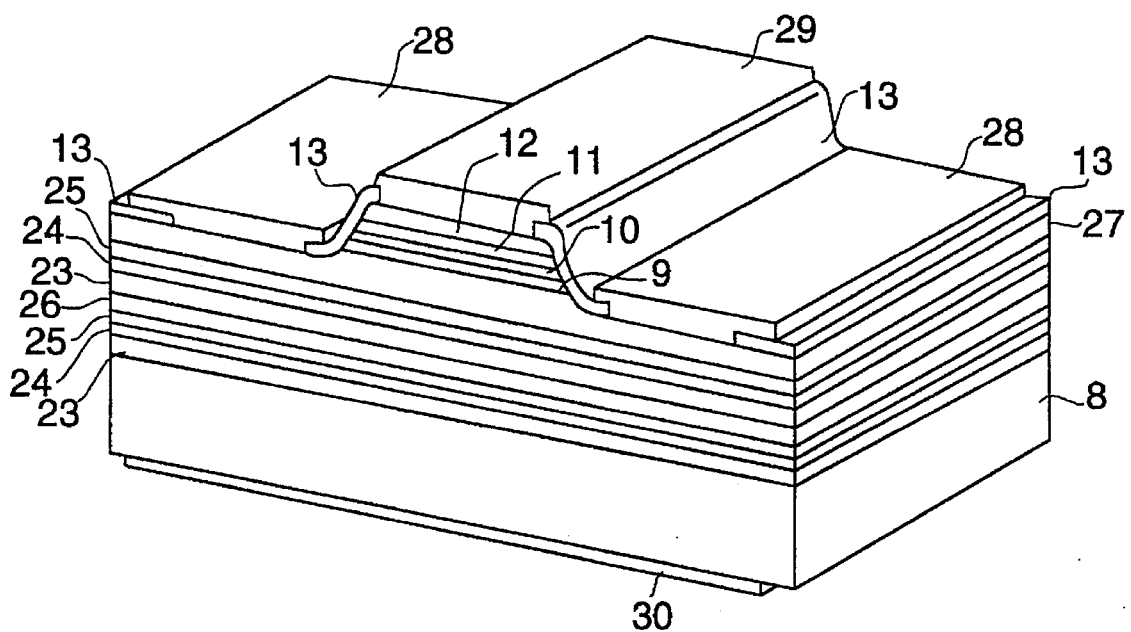
FIG. 11 is a perspective view of a semiconductor laser device according to an embodiment of the present invention.
Figure 12:
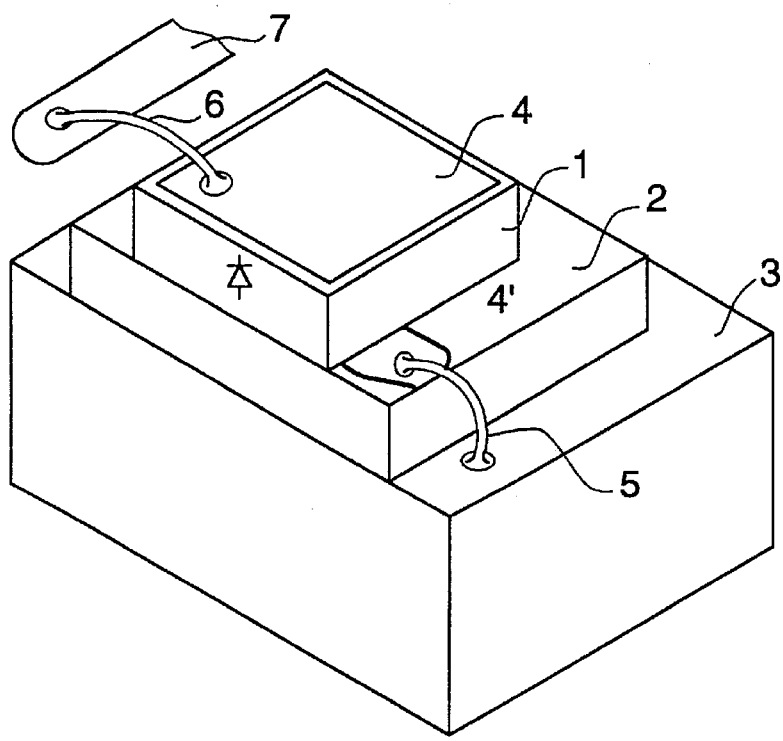
FIG. 12 is a perspective view of a conventional semiconductor laser device.

In the seventh embodiment, instead of using a separate heat sink including at least one pn junction and a separate semiconductor laser chip, a heat sink including a reverse current blocking diode and a semiconductor laser are prepared as a unitary body in a continuous crystalline material growth process. FIGS. 10 and 11 are, respectively, a schematic cross-sectional view of a semiconductor laser device according to the seventh embodiment and a perspective view of a portion of that semiconductor laser device. These structures include a p-type InP layer 23, a p⁺-type InP layer 24, an n⁺-type InP layer 25, an n-type InP layer 26, and then three additional layers 23, 24, and 25 repeating the first three layers. These layers form a reverse current blocking diode and a tunnel diode. The p⁺ layer 24 and the n⁺ layer 25 form a tunnel diode within the layers 23–26 to ensure that forward current easily flows through the layers forming the pn junction. If two layers 24 and two layers 25 are present, an additional tunnel diode is formed to ensure good contact to the contact layer 27. An n-type InP contact layer 27 that is common to the reverse current blocking diode and to the semiconductor laser part of the structure is disposed on the last grown layer of the reverse current blocking diode. The structure on the opposite side of the layer 27 from the reverse current blocking diode is a semiconductor laser structure. The reverse current blocking diode and the semiconductor laser commonly employ an electrode 28 that contacts the n-type InP contact layer 27. In addition, an electrode 29 forms the second contact to the semiconductor laser structure and an electrode 30 on the rear surface of the substrate 8 provides the second contact to the reverse current blocking diode.

The structure of FIGS. 10 and 11 is prepared by sequentially growing on an n-type InP substrate 8 the layers 23, 24, 25, and 26 in an epitaxial growth process to provide the reverse current blocking diode. As illustrated in FIG. 11, additional layers 23, 24, and 25 may also be grown. After completion of growth of these reverse current blocking diode layers, the n-type InP contact layer 27 is grown, followed by the growth of the semiconductor layers of the semiconductor laser structure. Parts of those layers forming the semiconductor laser are removed, using conventional technology, to expose a part of the contact layer 27 for making an electrical contact to the reverse current blocking diode. An insulating film 13 made of a suitable material, such as $SiO_2$, is deposited on the entire surface of the structure and windows are opened in the insulating film to form the common electrode 28 and the laser electrode 29. Similarly, the rear surface electrode 30 is formed, completing the structure. Thereafter, as shown in FIG. 10, the structure is bonded to a block 3 and the wire 5 is attached, connecting the laser electrode 29 to the block 3.

The integrated semiconductor laser chip and heat sink structure eliminates the necessity of bonding a heat sink to a semiconductor laser chip, reducing manufacturing costs and simplifying the assembly process.

The invention has been described with respect to certain preferred embodiments. However, various modifications and additions within the spirit of the invention will be apparent to those of skill in the art from the foregoing description. Accordingly, the scope of the invention is limited solely by the following claims.

I claim:

1. A semiconductor laser device comprising:

a semiconductor laser chip including a diode having a polarity;

a heat sink made of the same material as the semiconductor chip and on which the semiconductor laser chip is mounted at an interface of the semiconductor laser chip and the heat sink, the heat sink including a unitary semiconductor body having a plurality of pn junctions generally parallel to the interface and arranged in series electrically, and a respective $n^+$-$p^+$ tunnel diode disposed between each adjacent pair of pn junctions; and a block on which the heat sink is mounted, wherein the diode of the semiconductor laser chip and the pn junctions of the heat sink arranged in series electrically are electrically connected in parallel and in opposite polarity so that the pn junctions of the heat sink function as a reverse current blocking diode for the semiconductor laser chip.

2. A semiconductor laser device comprising:

a first semiconductor laser chip including a diode having polarity;

a heat sink comprising a second semiconductor laser chip on which the first semiconductor laser chip is mounted at an interface of the first semiconductor laser chip and the heat sink, the heat sink including a pn junction generally parallel to the interface; and a block on which the heat sink is mounted, wherein the diode of the semiconductor laser chip and the pn junction of the heat sink are electrically connected in parallel and in opposite polarity so that the pn junction of the heat sink functions as a reverse current blocking diode for the first semiconductor laser chip.

3. The semiconductor laser device according to claim 2 wherein the first semiconductor laser chip and the heat sink are made of the same material.

4. A semiconductor laser device comprising:

a first semiconductor laser chip including a diode having a polarity;

a heat sink comprising a plurality of laminated heat sink elements including a second semiconductor laser chip, each heat sink element including a pn junction, the first semiconductor laser chip being mounted at an interface of the first semiconductor laser chip and the heat sink, the heat sink including at least one pn junction generally parallel to the interface; and a block on which the heat sink is mounted, wherein the diode of the first semiconductor laser chip and the pn junctions of the heat sink are electrically connected in parallel and in opposite polarity, the pn junctions functioning as series-connected reverse current blocking diodes for the first semiconductor laser chip.

5. The semiconductor laser device according to claim 4 wherein the first semiconductor laser chip and the heat sink are made of the same material.

* * * * *